United States Patent
Hart et al.

(10) Patent No.: US 10,112,836 B2
(45) Date of Patent: Oct. 30, 2018

(54) CONTINUOUS NANOSYNTHESIS APPARATUS AND PROCESS

(71) Applicant: The Regents of The University of Michigan, Ann Arbor, MI (US)

(72) Inventors: Anastasios John Hart, Somerville, MA (US); Erik Polsen, New Baltimore, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 14/090,816

(22) Filed: Nov. 26, 2013

(65) Prior Publication Data
US 2014/0147592 A1    May 29, 2014

Related U.S. Application Data

(60) Provisional application No. 61/729,941, filed on Nov. 26, 2012.

(51) Int. Cl.
| | |
|---|---|
| C23C 16/455 | (2006.01) |
| C23C 16/46 | (2006.01) |
| C23C 16/54 | (2006.01) |
| B01J 19/18 | (2006.01) |
| B01J 19/22 | (2006.01) |
| B05C 3/12 | (2006.01) |
| B05C 5/00 | (2006.01) |

(Continued)

(52) U.S. Cl.
CPC ......... *C01B 31/024* (2013.01); *B01J 19/1843* (2013.01); *B01J 19/22* (2013.01); *B05C 3/005* (2013.01); *C01B 31/0446* (2013.01); *C01B 33/021* (2013.01); *C01G 9/02* (2013.01); *C30B 7/10* (2013.01); *C30B 25/08* (2013.01); *C30B 29/16* (2013.01); *C30B 29/60* (2013.01); *B05C 3/125* (2013.01); *B05C 3/132* (2013.01); *B82Y 40/00* (2013.01); *C23C 16/45502* (2013.01); *C23C 16/46* (2013.01); *C23C 16/545* (2013.01)

(58) Field of Classification Search
USPC ........................................................ 118/718
See application file for complete search history.

(56) References Cited

U.S. PATENT DOCUMENTS 3,884,787 A * 5/1975 Kuehnle .................. 204/192.12
5,029,598 A * 7/1991 Stroszynski et al. ............. 137/1

(Continued)

FOREIGN PATENT DOCUMENTS

WO    WO 2011099858 A1 *    8/2011

*Primary Examiner* — Karla A Moore
(74) *Attorney, Agent, or Firm* — Reising Ethington P.C.

(57) ABSTRACT

A nanosynthesis apparatus includes an outer tube and an inner tube with surfaces that oppose each other across a gap as part of a reaction chamber. A deposition fluid flows along the reaction chamber to grow nanostructures such as graphene or carbon nanotubes on a substrate in the reaction chamber. The reaction chamber may have an annular cross-section, and the growth substrate may wrap around the inner tube in a helical manner. This configuration can allow a flexible film substrate to travel through the reaction chamber along a path that is significantly longer than the length of the reaction chamber while maintaining a uniform gap between the substrate and the reaction chamber wall, which can facilitate a uniform temperature distribution and fluid composition across the width of the substrate.

36 Claims, 7 Drawing Sheets

(51) Int. Cl.

| | |
|---|---|
| *B82Y 40/00* | (2011.01) |
| *C01B 31/02* | (2006.01) |
| *B05C 3/00* | (2006.01) |
| *C01B 31/04* | (2006.01) |
| *C01B 33/021* | (2006.01) |
| *C01G 9/02* | (2006.01) |
| *C30B 7/10* | (2006.01) |
| *C30B 25/08* | (2006.01) |
| *C30B 29/16* | (2006.01) |
| *C30B 29/60* | (2006.01) |
| *B05C 3/132* | (2006.01) |

(56) References Cited

U.S. PATENT DOCUMENTS

| | | | | |
|---|---|---|---|---|
| 5,296,011 | A * | 3/1994 | Aikawa et al. | 65/423 |
| 5,547,512 | A * | 8/1996 | Gabor et al. | 118/718 |
| 6,787,229 | B1 * | 9/2004 | Muradov | 428/367 |
| 7,824,495 | B1 * | 11/2010 | White et al. | 118/718 |
| 2002/0134507 | A1 * | 9/2002 | DeDontney et al. | 156/345.33 |
| 2005/0186338 | A1 * | 8/2005 | Roscheisen | C23C 16/405 427/248.1 |
| 2006/0275548 | A1 * | 12/2006 | Storer et al. | 427/251 |
| 2008/0095938 | A1 * | 4/2008 | Basol | 427/255.26 |
| 2011/0056726 | A1 * | 3/2011 | Schuller | B05D 1/60 174/110 R |
| 2013/0064977 | A1 * | 3/2013 | Vermeer et al. | 427/255.5 |

* cited by examiner

CONTINUOUS NANOSYNTHESIS APPARATUS AND PROCESS

This application claims the benefit of U.S. Provisional Application No. 61/729,941, filed Nov. 26, 2012, the entire contents of which are hereby incorporated by reference.

GOVERNMENT LICENSE RIGHTS

This invention was made with government support under DMR1120187 awarded by the National Science Foundation. The government has certain rights in the invention.

TECHNICAL FIELD

This disclosure relates generally to structures and methods for use in nanostructure and/or nanofilm synthesis processes.

BACKGROUND

Nanostructures such as carbon nanotubes (CNTs) and semiconductor nanowires can be synthesized using a number of known techniques. For example, vapor deposition techniques have been developed in which catalyst nanoparticles at elevated temperatures in a controlled environment act as growth sites for nanostructures. Gaseous substances that include the desired atomic constituents may be broken down for nanostructure assembly in the presence of such catalysts. For example, carbon atoms may be provided by a hydrocarbon gas source in a typical vapor deposition process for synthesizing CNTs. Batch processing is common but somewhat limiting in that a new reaction must be started, usually with a new growth substrate, each time more nanostructures are desired. Such processes do not lend themselves to scaled-up nanostructure manufacturing on an industrial or commercial scale. Some continuous processes have been proposed, but the necessity for careful control of the growth environment and the order in which growth conditions must change for successful nanostructure growth does not always lend itself to dynamic processes where the growth substrate and/or catalyst is moving from one location to another during the process. These issues are also present when manufacturing thin films on indefinite substrates, such as by atomic layer deposition (ALD) methods.

SUMMARY

In accordance with one or more embodiments, a nanosynthesis apparatus includes an outer tube having an internal surface, and an inner tube at least partially disposed within the outer tube. The inner tube has an external surface that opposes the internal surface of the outer tube across a gap. The apparatus includes a deposition fluid source in fluid communication with the gap and a heater arranged to heat at least a portion of the gap during operation.

In accordance with one or more embodiments, a method of nanosynthesis includes the steps of: placing a growth substrate in a reaction chamber having an annular cross-section; and flowing a deposition fluid through at least a portion of the reaction chamber in an axial direction, whereby a constituent of the fluid is deposited along the growth substrate as part of a nanostructure.

In accordance with one or more embodiments, a method of nanosynthesis includes the step of moving a growth substrate through a reaction chamber in the presence of a deposition fluid so that portions of the substrate are simultaneously rotated about an axis and translated in the direction of the axis, whereby a constituent of the fluid is deposited along the substrate as part of a nanostructure.

BRIEF DESCRIPTION OF THE DRAWINGS

Preferred exemplary embodiments of the invention will hereinafter be described in conjunction with the appended drawings, wherein like designations denote like elements, and wherein.

DESCRIPTION OF THE ILLUSTRATED EMBODIMENTS

Nanostructures of the type contemplated herein are structures having one or more Cartesian dimensions in the nanoscale. Some nanostructures have two dimensions in the nanoscale, such as elongated structures having a diameter or plural cross-sectional dimensions within the general range of 0.1 to 100 nanometers. These include, for example, nanotubes, nanowires, nanorods, nanocolumns, and nanofibers. Other nanostructures have only one dimension in the nanoscale, such as graphene sheets, epitaxial structures, and other films having a thickness in the nanoscale, are also considered nanostructures. Some nanostructures have their largest dimension on the nanoscale (i.e., all three Cartesian dimensions are on the nanoscale) and may be alternatively be referred to as nanoparticles. In the following description, the various methods of growing, assembling, or otherwise synthesizing nanostructures are generally referred to as nanosynthesis.

The nanosynthesis apparatus and method described herein can provide nanostructure growth in a continuous manner that may be scaled-up and automated to realize industrial or commercial nanostructure production. The apparatus enables portions of a growth substrate to be rotated about a longitudinal axis and simultaneously translated in the direction of the longitudinal axis through a reaction chamber. The resulting path of the growth substrate through the reaction chamber may be a helical path. The reaction chamber may have an annular cross-section through which a deposition fluid flows. This configuration can allow a flexible film substrate to travel through the reaction chamber along a path that is significantly longer than the length of the reaction chamber while maintaining a uniform gap between the substrate and the reaction chamber wall, which can facilitate a uniform temperature distribution and fluid composition across the width of the film. Reaction chamber walls having rounded cross-sectional shapes can be sealed more effectively and are stronger than other shapes when the interior of the chamber is held at a negative or positive pressure, making the apparatus capable of operation at larger pressure differentials.

Figure 1:
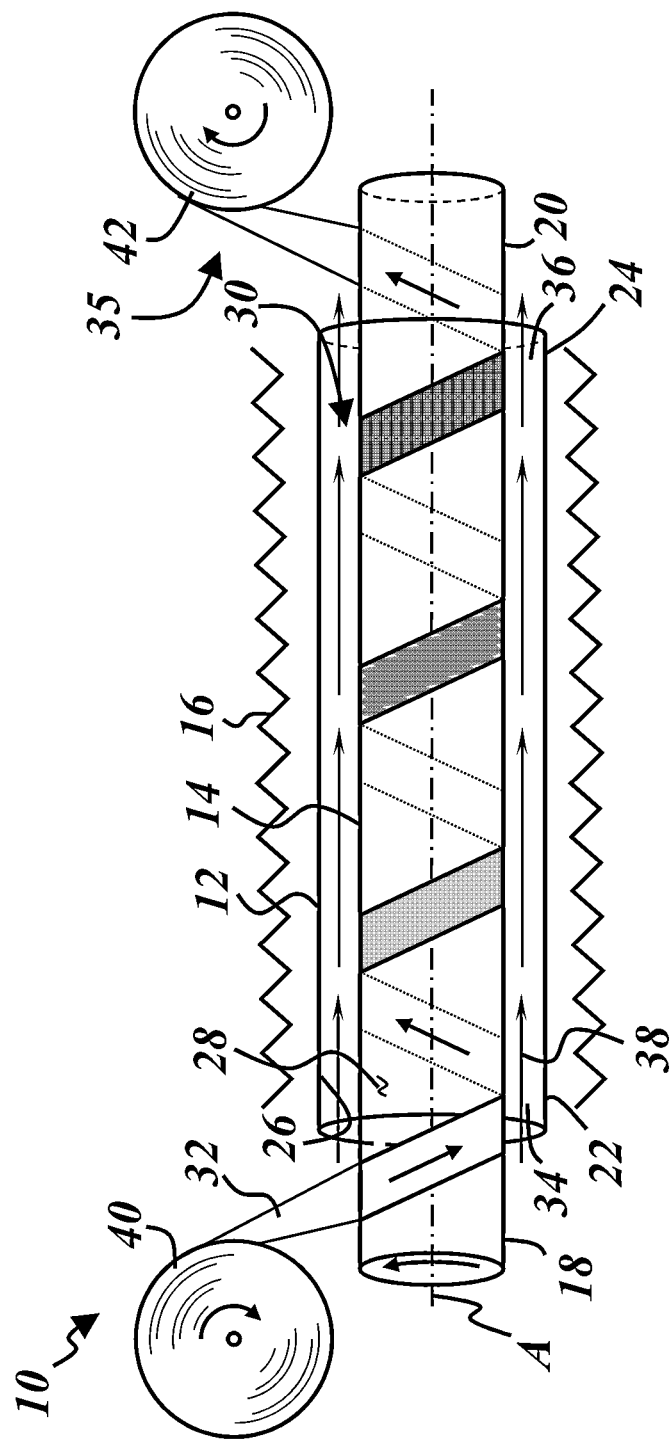
FIG. 1 is a schematic view of an embodiment of a nanosynthesis apparatus.

Referring to FIG. 1, there is shown schematically an illustrative nanosynthesis apparatus 10. The apparatus includes an outer tube 12, an inner tube 14, a heater 16, and a deposition fluid source (not shown in FIG. 1). The inner tube 14 is disposed at least partially within the outer tube 12. In this example, the inner tube 14 is longer than the outer tube 12, and opposite first and second ends 18, 20 of the inner tube extend beyond opposite first and second ends 22, 24 of the outer tube. An internal surface 26 of the outer tube 12 opposes an external surface 28 of the inner tube 14 across a gap 30. The gap 30 is sized to accommodate a growth substrate 32, which in this case is a flexible foil or film. The gap size may also be selected to achieve desired fluid flow characteristics therealong or with other considerations. In use, the gap 30 is a reaction chamber with opposite first and second ends 34, 36. The heater 16 is provided to heat the reaction chamber 30 and the materials located therein. The heater 16 may be configured to circumscribe at least a portion of the reaction chamber 30 with a uniform gap or uniform contact along the reaction chamber. Any type of heater 16 may be used, more than one heater may be included, and the heater(s) may be located elsewhere, such as inside the inner tube 14. In one embodiment, the heater 16 is a tube furnace.

The deposition fluid source is in fluid communication with the reaction chamber 30 so that a deposition fluid 38 can flow through at least a portion of the chamber generally in the axial direction as shown. Of course, the fluid flow field in the gap 30 may include non-axial components. In the illustrated example, the deposition fluid 38 is flowing in a direction from the first end 34 of the reaction chamber 30 toward the second end 36, but the fluid flow could be in either direction and may be reversible. The deposition fluid 38 is any gas or liquid with a constituent that is deposited along the substrate 32 as part of a nanostructure under nanostructure growth conditions. For example, a hydrocarbon gas may be flowed through the reaction chamber 30 in a particular temperature and pressure range and in the presence of a catalyst to synthesize carbon nanotubes (CNTs) or some other fullerene. The catalyst may be in the form of nanoparticles deposited on the substrate surface, or the substrate may itself be the catalyst. In practice, the gas flowing through the reaction chamber may be a mixture of one or more deposition fluids and/or one or more other fluids, such as a conditioning fluid. Some examples are described below.

FIG. 1 depicts nanostructure growth along the substrate 32. The substrate material at the second end 36 of the chamber 30 has more nanostructure growth than substrate material at the first end 34, which is shown in the figure as the substrate appearing darker at the second end of the reaction chamber than at the first end. There may be more nanostructure growth at the second end of the reaction chamber 30 due to the higher concentration of deposition gas at the second end, due to the temperature of the substrate being higher at the second end, due to the substrate at the second end having been in the chamber for a greater amount of time than the substrate at the first end, or for other reasons. For instance, in the illustrated embodiment, the substrate 32 moves through the reaction chamber 30 in a direction from the first end 34 to the second end 36 and follows a helical path along the way. In this particular example, a feed system 35 moves the substrate through the reaction chamber. The feed system in this example includes a supply spool 40, a collection spool 42, and a motor 50 (not shown in FIG. 1). The substrate 32 enters the reaction chamber from the supply spool 40 and is collected on the collection spool 42. Portions of the substrate 32 rotate about a longitudinal axis A and are simultaneously translated in the direction of the longitudinal axis through the reaction chamber 30. Though the illustrated embodiment shows a helical path, other path shapes are possible—e.g., the shape of the reaction chamber could change along its length, the pitch of the coiled substrate could be irregular, etc. In this case, the outer and inner tubes, 12, 14 have constant diameters along their lengths, resulting in a uniform gap therebetween. Some of the benefits of the annular reaction chamber cross-section may be realized even in embodiments in which the substrate does not move through the reaction chamber, and non-helical substrates may be used. For example, a tubular substrate could be fed through the annular cross-section of the reaction chamber in translation only, or any shape of substrate may be fed through the annular cross-section without following a helical path.

In the illustrated embodiment, the substrate 32 is kept in tension by the feed system 35 during movement through the reaction chamber 30. The collection spool 42 rotates to pull the substrate strip through the chamber. The spool 42 may be turned by the motor 50, such as a stepper motor, or it can be manually operated or moved by a different type of actuator such as a power screw or other device. The supply spool 40 may be equipped with a slip-clutch that allows the spool to turn when a particular torque is reached to help keep the substrate in tension. In this example, movement of the substrate 32 is sliding movement at the interface of the substrate and the external surface 28 of the inner tube 14. As shown, the inner tube 14 may optionally counter-rotate to avoid stick-and-slip movement of the substrate through the reaction chamber by maintaining the lower dynamic coefficient of friction present during relative surface movement. The amount of force required to pull the substrate along the external surface 28 of the inner tube 14 depends on several factors, such as the materials involved, the total contact area between the substrate and the inner tube, and the number of times the substrate wraps the inner tube (related to the pitch of the helical path). Some of these relationships are described in more detail below. Care should be exercised in keeping the tension required to pull the substrate through the reaction chamber sufficiently low to avoid reaching the yield or tensile strength of the substrate.

Figure 2:
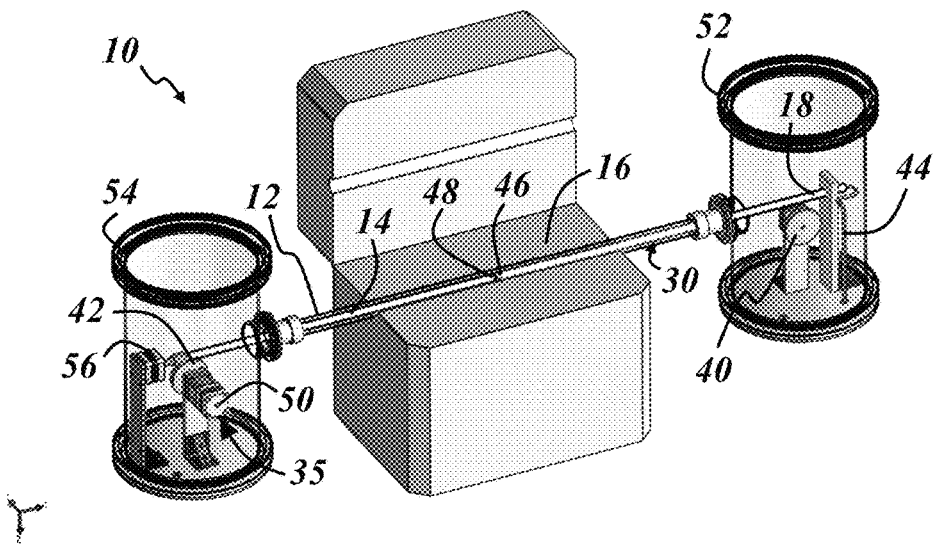
FIG. 2 is a perspective view of another embodiment of the nanosynthesis apparatus.

FIG. 2 illustrates one embodiment of the nanosynthesis apparatus, with some of the same components from the schematic illustration of FIG. 1 labeled, including the outer tube 12, the inner tube 14, the heater 16, the reaction chamber 30, and the spools 40, 42. FIG. 2 also shows the deposition fluid source 44. In this example, the fluid source 44 is in fluid communication with the reaction chamber 30 via apertures 46 formed through the inner tube 14 and located between opposite ends of the inner tube and of the reaction chamber. More specifically, the fluid source 44 is in fluid communication with the first end 18 of the inner tube 14 so that the deposition fluid can flow from the fluid source, through a portion of the inner tube, and into the reaction chamber 30 through the apertures 46. Apertures may be located at multiple locations along the length of the reaction chamber 30 to supply different fluids and/or different amounts of fluids at various portions of the reaction chamber. Alternatively or additionally, apertures may be formed through the outer tube 12 at one or more locations along the length of the reaction chamber. In this example, a partition 48 is included inside the inner tube 14 at a location that helps direct deposition fluid flow through the apertures 46 and into the reaction chamber 30. A stepper motor 50 is shown operatively connected with the collection spool 42.

In this embodiment, the apparatus 10 includes first and second end chambers 52, 54. Each is vacuum-compatible and sealable. The first end chamber 52 houses the connection between the deposition fluid source 44 and the inner tube 14, as well as the supply spool 40 and the slip-clutch, where so-equipped. The second end chamber 54 houses the collection spool 42 and the motor 50. The outer tube 12 extends between the two end chambers and fluidly connects their respective internal volumes. The round cross-section of the outer tube 12 facilitates a good seal with the end chambers. The inner tube 14 extends through the outer tube 12 to connect with the fluid source 44 in the first end chamber 52 and to connect with another motor 56 operatively connected with the inner tube for optional rotation. The inner tube 14 may be supported at its opposite ends as shown and/or may be supported within the outer tube via bearings or low-friction bushings when the inner tube is configured for rotation. In the example of FIG. 2, the first end chamber 52 may act as a second fluid source in fluid communication with the reaction chamber 30. For example, the end chamber 52 may be pressurized with a conditioning fluid, such as a noble gas or noble gas-containing mixture that can flow over the substrate in the reaction chamber in a first region of the reaction chamber between the first end of the reaction chamber and the apertures 46. The conditioning fluid may shield the substrate as it gets up to temperature prior to reaching the portion of the reaction chamber where deposition fluid is present. The conditioning fluid may also serve to ensure that the deposition fluid flows in the desired direction in the reaction chamber 30. The second end chamber 54 may thus receive a mixture of gases, including the one or more deposition fluids and/or conditioning fluids from the second end of the reaction chamber 30 and act as a system exhaust location. It is noted for clarity that in the configuration of FIG. 2, the substrate and deposition fluid move in the opposite direction (i.e., right-to-left in the figure) than the substrate and deposition fluid in the configuration of FIG. 1 (i.e., left-to-right in the figure).

Figure 3:
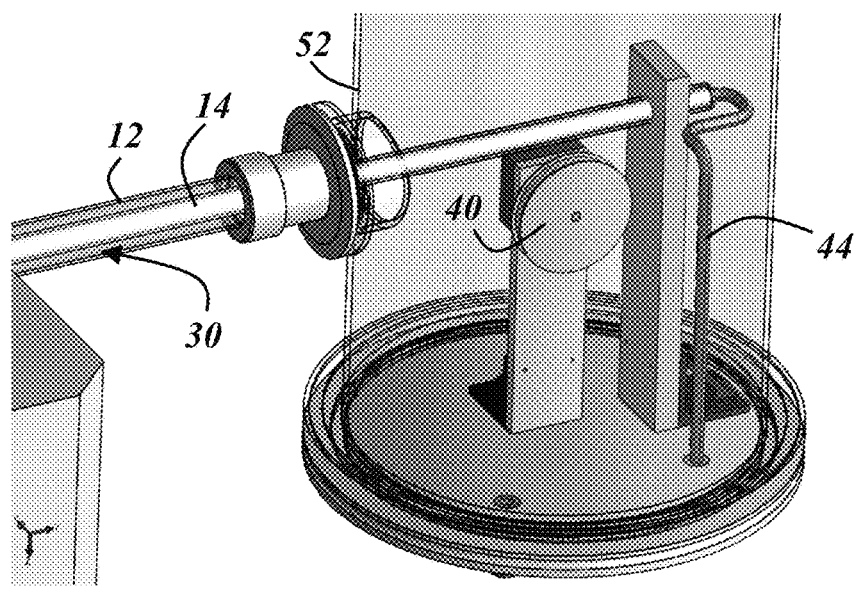
FIG. 3 is an enlarged view of an end chamber from FIG. 2.
Figure 4:
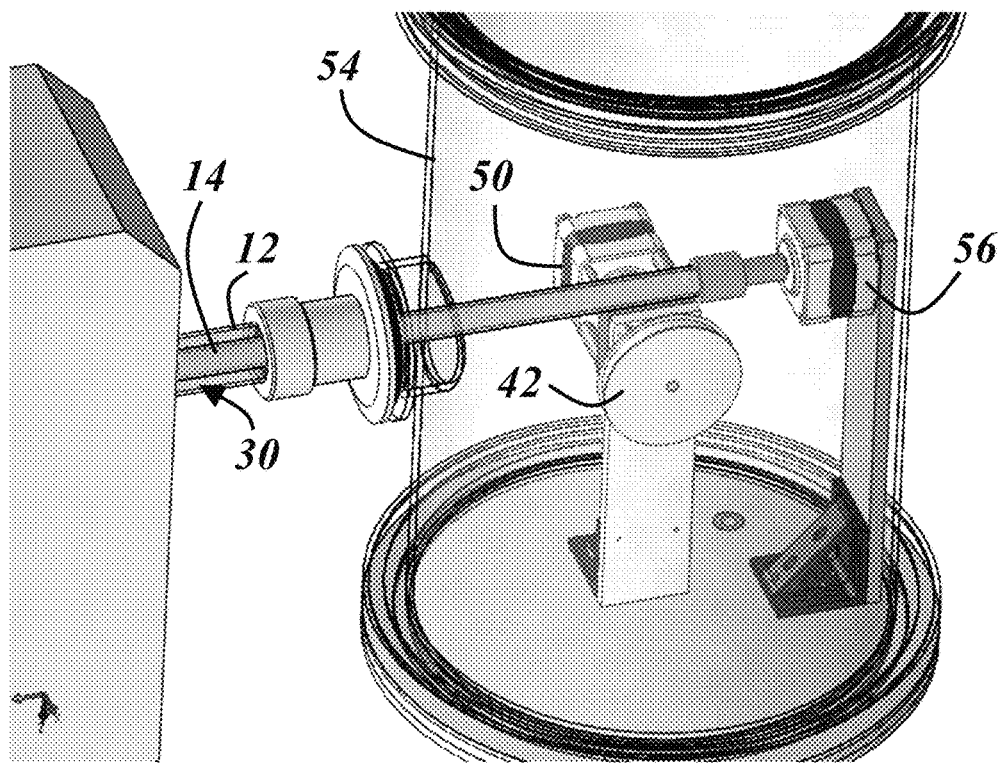
FIG. 4 is an enlarged view of another end chamber from FIG. 2.
Figure 5:
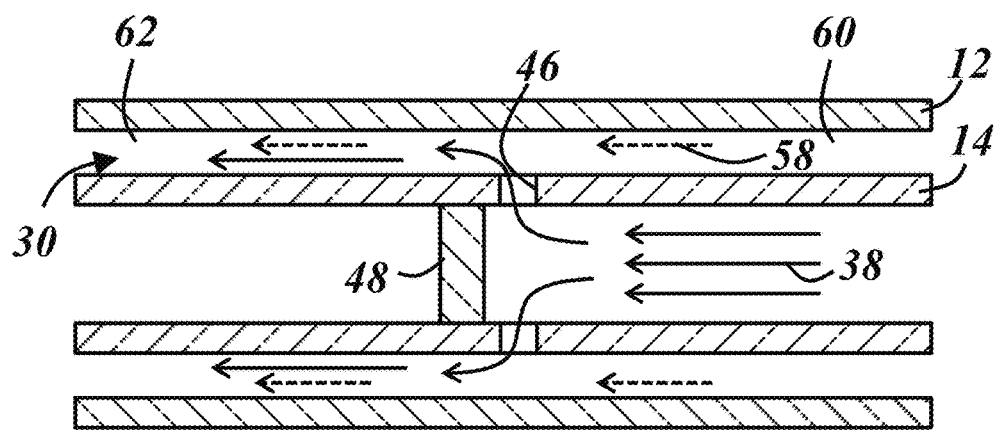
FIG. 5 is a cross-sectional view of a reaction chamber of the apparatus of FIGS. 2-4.

FIGS. 3 and 4 are respective enlarged views of the first and second end chambers 52, 54 of FIG. 2 with some of the components labeled consistent with FIGS. 1 and 2. It is also noted that FIG. 4 is a view of the back side of the second end chamber 54 as oriented in FIG. 2. FIG. 5 is a cross-sectional view of the reaction chamber 30 of FIG. 2, showing fluid flow through the tubes 12, 14 and through the apertures 46. The deposition fluid 38 flows through the inner tube 14 and into the reaction chamber 30 via the apertures 46 to mix with the conditioning gas 58 flowing through the reaction chamber 30 between the tubes 12, 14. Also shown in FIG. 5 is the partition 48. In this case, the partition 48 is a quartz wall fused within the inner tube 14 perpendicular with the axis of the tube, but it could take any form and may be adjustable or moveable along the length of the inner tube 14 to correspond with other aperture locations. The portion of the reaction chamber 30 upstream from the apertures 46 may be referred to as an annealing zone 60, and the portion of the chamber downstream from the apertures may be referred to as a growth zone 62. The apertures 46 shown here are round, but they can of course be in any shape to form a fluid flow path between the inside of the inner tube and the reaction chamber 30.

In another embodiment, at least one other fluid is flowed through at least a portion of the reaction chamber 30. For example, an additional tube may be located inside the inner tube 14 so that a third fluid can be added to the reaction chamber 30. In another example, the third fluid flows from the second end of the inner tube and into the reaction chamber via one or more apertures formed through the inner tube. The third fluid may be a deposition fluid or a conditioning fluid. For example, the third fluid may be flowed into the reaction chamber 30 downstream of the location where the above-described deposition fluid 38 flows into the reaction chamber and part way through the growth zone 62 to change the growth composition. There is virtually no limit to the number of additional fluids that can be flowed into the reaction chamber.

In another embodiment, the substrate is moved through the reaction chamber in both axial directions. For example, the feed system may be arranged so that both spools in the previous figures are operatively connected with motors that turn in opposite directions. Thus portions of the growth substrate could remain in the reaction chamber for a time longer than the feed rate would otherwise dictate by reversing the feed system as desired.

With reference to the embodiment of FIGS. 2-5 a chemical vapor deposition (CVD) process is possible. The substrate is annealed and/or heated in the annealing zone 60 and, if present, the catalyst nanoparticles are subjected to a reducing atmosphere. Once pre-treated, the substrate enters the growth zone 62 while still in the heated region, that is suitable for the generation of the desired nanostructure. For example, a mixture of hydrogen and helium may be flowed through the reaction chamber 30 from its first end at the annealing zone 60 to its second end at the growth zone 62, with ethylene gas flowed into the reaction chamber via the inner tube and apertures 46 to grow carbon-based nanostructures, such as carbon nanotubes or graphene. The substrate may be moved to an optional delamination device, where the nanostructures are separated from the growth substrate and transferred to a secondary substrate suitable for the intended application. The growth substrate and/or the secondary substrate is then collected on the collection spool where it awaits further processing for device integration. Liquid processes are also possible. In one example, a liquid deposition fluid may be flowed into the inner tube and heated to its phase change temperature so that it enters the reaction chamber as a gas. In another example, liquid-phase nanostructure growth is possible, such as hydrothermal growth of ZnO nanowires. For instance, a first liquid deposition fluid flowed through the entire length of the reaction chamber could grow a first type of nanostructure, and a second liquid deposition fluid could flow into the reaction chamber via the inner tube to modify and/or grow a second type of nanostructure. Or the first liquid could be used to prepare the substrate in the manner of a conditioning fluid.

Figure 6:
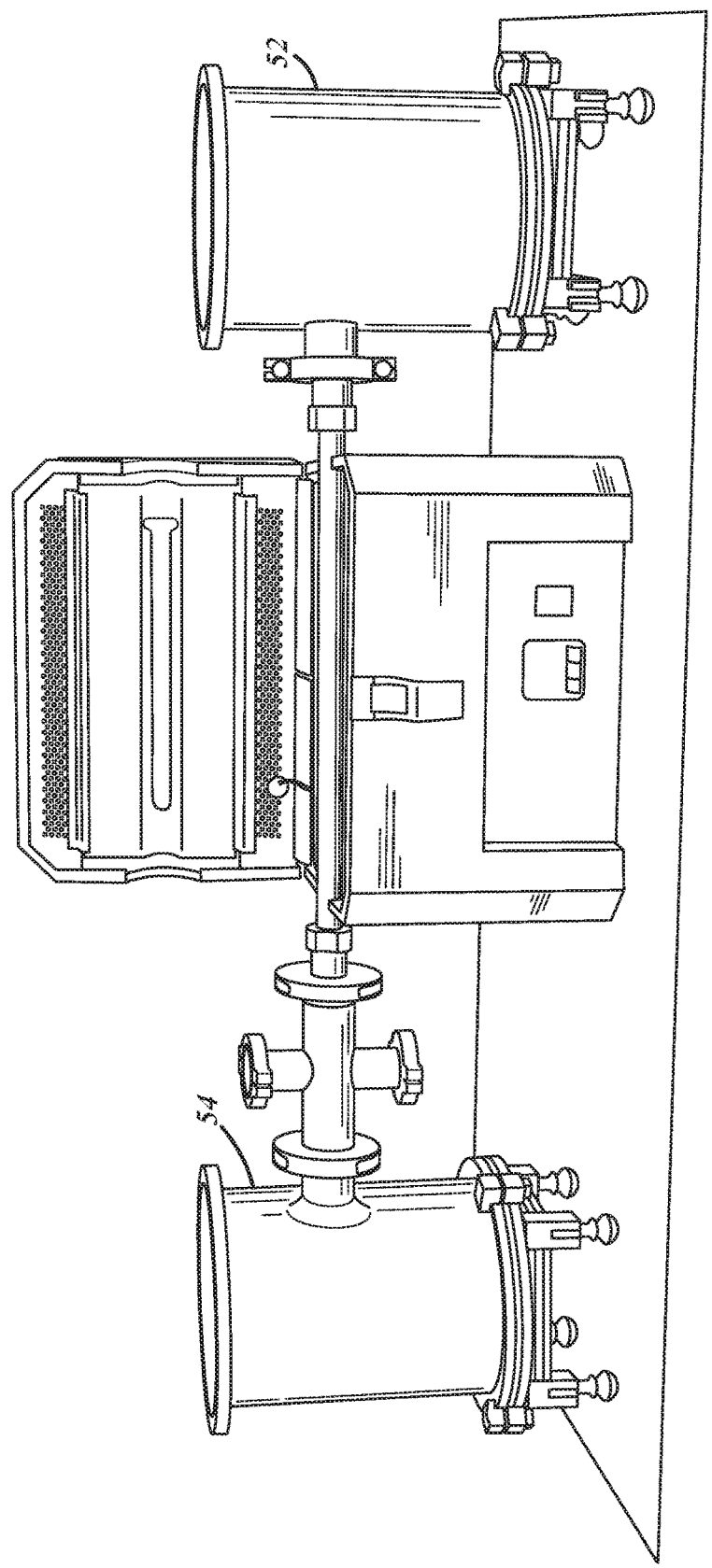
FIG. 6 is a schematic depiction of a photographic image of a working model of the nanosynthesis apparatus.
Figure 7:
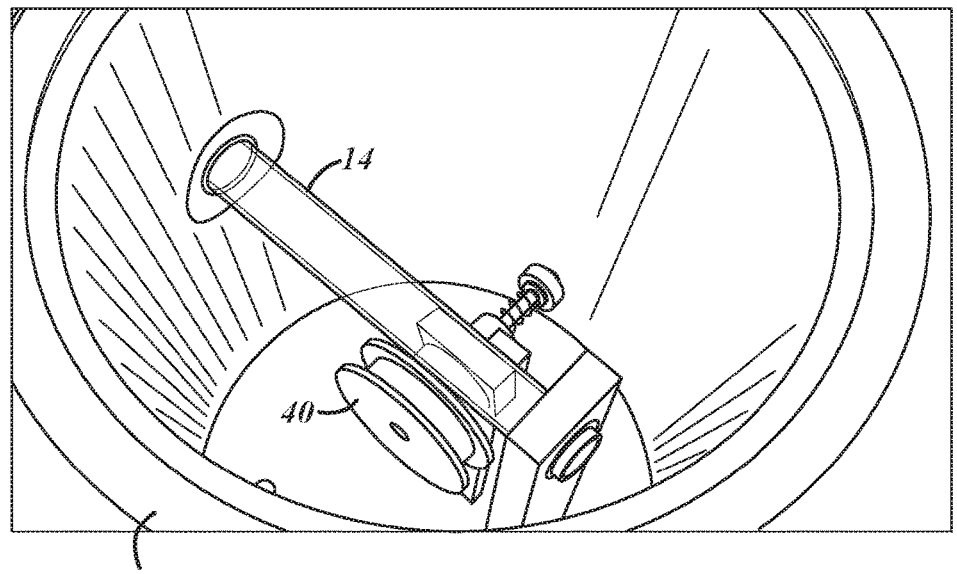
FIG. 7 is a schematic depiction of a photographic image of one of the end chambers of the apparatus of FIG. 6.
Figure 8:
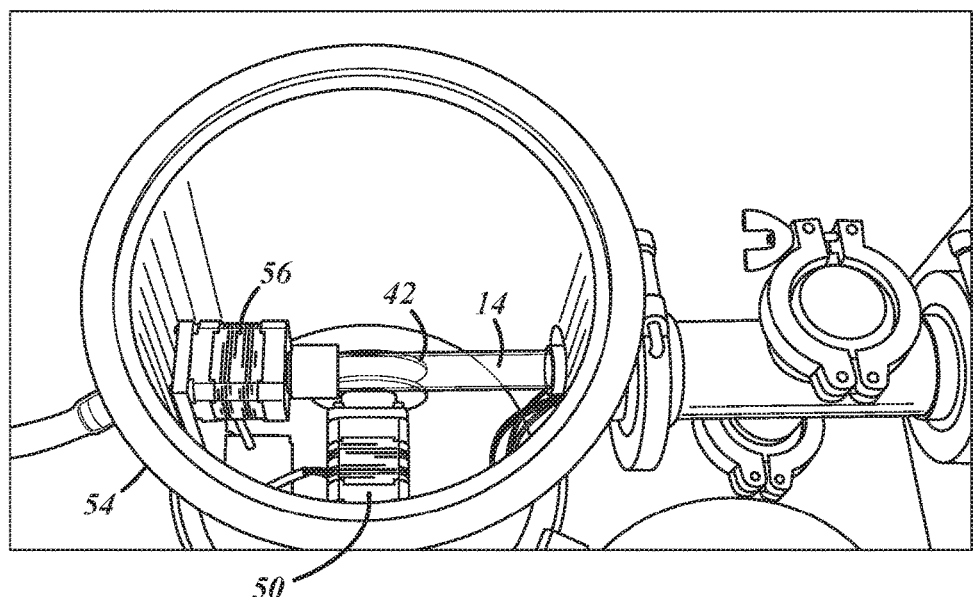
FIG. 8 is a schematic depiction of a photographic image of the other end chamber of the apparatus of FIG. 6.
Figure 9:
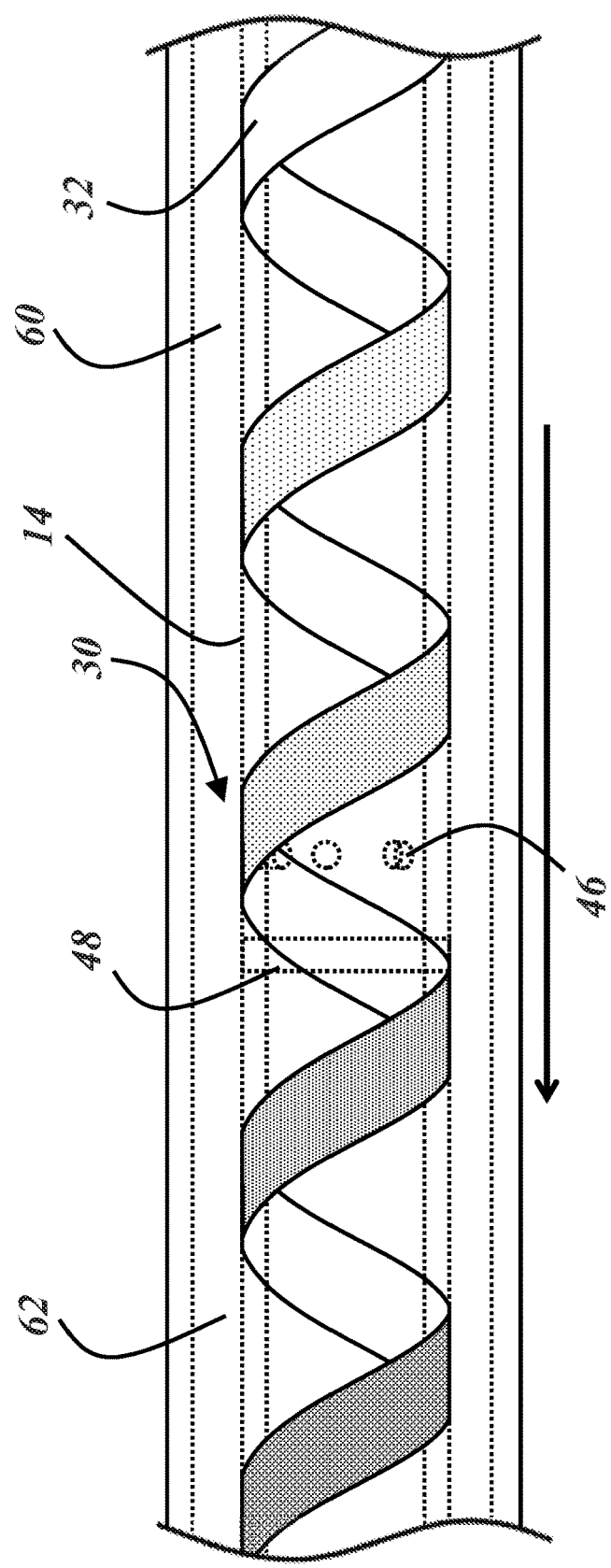
FIG. 9 is a schematic depiction of a photographic image of a growth substrate in the reaction chamber of the apparatus of FIG. 6 with graphene film grown thereon.

A working model of the nanosynthesis apparatus according to the above disclosure has been fabricated, as depicted in FIG. 6. FIG. 7 is an enlarged view of the first end chamber 52, housing the supply spool 40 and connection between the deposition fluid source and the inner tube 14. FIG. 8 is an enlarged view of the second end chamber 54, housing the collection spool 42 and motors 50, 56 for the collection spool and inner tube 14 rotation, respectively. FIG. 9 depicts an example of a nickel substrate in the reaction chamber with graphene film grown along the substrate 32 surface in the growth zone 62 of the reaction chamber, downstream from the apertures 46 that provide fluid flow from the inner tube 14 to the reaction chamber. The partition 48 is also visible in this schematic depiction of a photographic image. This particular substrate was subjected to static growth (i.e., the substrate did not move through the reaction chamber). Experiments with a moving substrate have been successfully performed, along with carbon nanotube growth.

Figure 10:
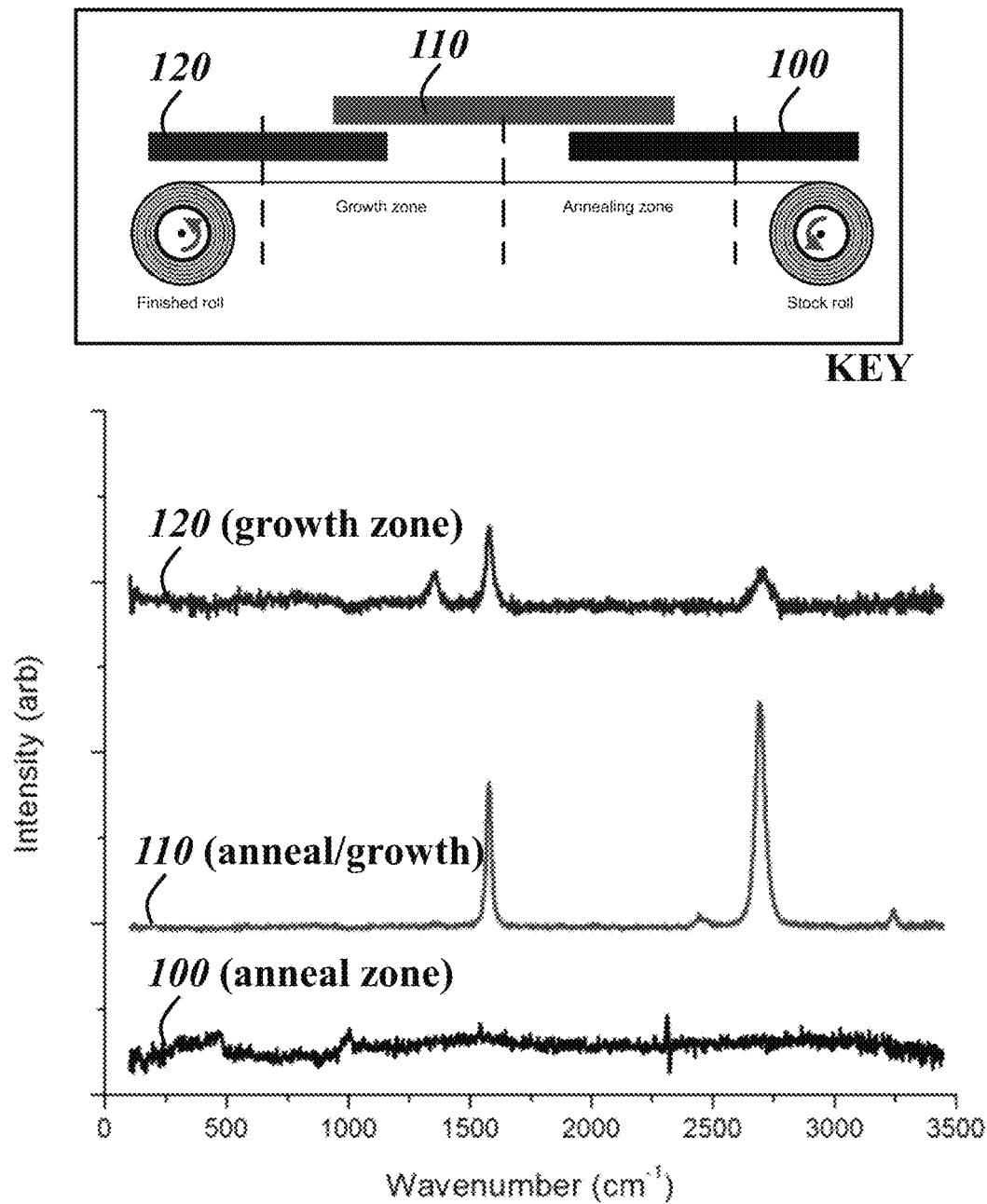
FIG. 10 illustrates Raman spectra taken along three different regions of the reaction chamber of FIG. 9.

FIG. 10 illustrates experimental results indicating that a configuration such as that depicted in FIGS. 5 and 9 indeed results in separate annealing and growth zones. Raman spectra are illustrated for three different portions of the growth substrate corresponding to three different regions along the length of the reaction chamber as shown in the key at the top of FIG. 10. Region 100 is in the annealing zone of the reaction chamber, region 110 overlaps the annealing and growth zones of the reaction chamber, and region 120 is in the growth zone. The peaks in spectra 110, 120 show the formation of graphene. These spectra also indicate that, when the substrate experiences only the growth zone (region 120), an additional defect peak is present in the spectrum. This suggests that the graphene generated using only the growth zone is of a lower quality than graphene produced in region 110, where the substrate experiences both annealing and growth conditions. It is noted that the spectra in FIG. 10 are shifted along the y-axis so they do not overlap for illustrative purposes (i.e., the bases of each of the spectra should all be considered as y=0). Spectrum 100 is collected from the annealed substrate only with no graphene formed on it. The two sharp peaks in spectrum 110 are the G and 2D peaks indicating graphene formation. The additional peak (below 1500 cm$^{-1}$) in spectrum 120 is the D peak indicating defects in the graphene.

In some of the above-described examples, given the helical (or similar) path of the substrate, which enables a smaller, uniform reaction chamber to be realized, additional friction between the substrate and the inner tube is generated due to the Capstan effect. The number of wraps around the inner tube exponentially increases the tension force required to generate slip between the substrate and the inner tube, according to the Capstan equation:

$$F_a = F_b e^{\mu \gamma},$$

where $F_a$ is the force required to induce slip, $F_b$ is the holding force, $\mu$ is the coefficient of friction, and $\gamma$ is the angle of contact. Additionally, increasing the pitch of the helical path can increase the number of wraps allowable for a given yield strength since an increasing portion of the tension force will be in the axial direction and no longer apply to the Capstan equation. Finally, the holding force, $F_b$, which impacts the amount of force required for substrate translation, $F_a$, is equal to the tension required to keep the substrate taut between the inner tube and the substrate supply. This holding force can be calculated using the wire-sag model:

$$H = wL^2/8f,$$

where H is the horizontal component of tension, w is the weight per unit length, L is the span length, and f is the deflection or sag. The holding force can be tuned via the substrate material type, cross-sectional dimensions, and suspended length. Coupled with computer control, the system becomes fully adjustable and automated. Control of the stepper motors allows the speed of the collection spool to be easily adjusted as the substrate accumulates on the spool in order to maintain a constant translational speed of the substrate, and in turn to adjust the inner tube rotation speed to allow the friction coefficient between the tube and the substrate to be maintained in the reduced kinetic regime. Mass flow controllers may be used to accurately control fluid flow and composition through the apparatus.

Tuning the performance of the system for controlled growth of carbon nanotube (CNT) films with specified height and density may be easily achieved through adjustment of the feed rate of the substrate and variations in the fluid composition. Sequential injection of fluid through the inner tube to achieve separate treatment zones allows for multiple inner tubes to be used to achieve additional treatment zones. Because all of the fluids flow through the same length of the heated region, the thermal treatment or decomposition of each of the fluids remains the same. In addition, the helical or similar path of the substrate through the gap between the inner and outer tubes allows for a uniform flow and temperature "experience" of the substrate. In fact, because the substrate rotates through the furnace, each point receives the same overall thermal history in spite of local spatial fluctuations in the temperature within the furnace. In principle, the gap between the tubes also limits the amount of gas needed for deposition, since the smaller cross-sectional area requires a lower flow rate to achieve the same average velocity of a larger reaction chamber, in turn leading to a higher conversion rate. This is further assisted by the increased contact time between the fluids and the substrate, because the fluid flow conforms to the surface of the inner tube. The use of and compatibility with conventional tube furnace architecture also increases the ease of sealing the end chambers with the tubes, and replacement parts such as quartz tubes are common off-the-shelf items. The design can also be adapted to a larger furnace by installing larger diameter and/or longer tubes. In principle the system can be reconfigured while allowing reuse of the drive systems. Also, the use of quartz tubes can allow optical access for possible in situ measurement and/or optical modification of process conditions. Because the substrate is always tangent to the tube surface, the system is less sensitive to distortions of the reference point due to the curvature of the tube. Other advantages will be recognized by skilled artisans.

It is to be understood that the foregoing description is not a definition of the invention, but is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that that the listing is not to be considered as excluding other, additional components or items. Other terms are to be construed using their broadest reasonable meaning unless they are used in a context that requires a different interpretation.

The invention claimed is:

1. A nanosynthesis apparatus, comprising:
   an outer tube having an internal surface;

an inner tube at least partially disposed within the outer tube, the inner tube having an external surface that opposes the internal surface of the outer tube across a gap having opposite first and second ends arranged along a longitudinal axis;

a feed system arranged to provide a growth substrate in the gap, wherein the growth substrate enters the gap at the first end of the gap, wraps at least partly around the inner tube in the gap, and exits the gap at the second end of the gap;

a deposition fluid source in fluid communication with the gap via an aperture formed through one of the tubes and located between the first and second ends of the gap, wherein an annealing zone is defined between the aperture and the first end of the gap and a growth zone is defined between the aperture and the second end of the gap;

a second fluid source coupled with the gap at the first end of the gap such that, in the presence of a pressure differential between the first and second ends of the gap, a second fluid from the second fluid source flows along the gap in an axial direction from the first end of the gap to the second end of the gap, the second fluid being confined to the gap while between the first and second ends of the gap;

a heater arranged to heat and control the temperature in at least a portion of the gap during operation of the apparatus, wherein, in the presence of a pressure differential between the deposition fluid source and the second end of the gap, a deposition fluid flows from the deposition fluid source, into the gap through the aperture, and toward the second end of the gap, and wherein, when both fluids are flowing along the gap, the gap is substantially free from the deposition fluid in the annealing zone and contains a mixture of both fluids in the growth zone.

2. A nanosynthesis apparatus as defined in claim 1, wherein the outer and inner tubes are concentric.

3. A nanosynthesis apparatus as defined in claim 1, wherein said internal and external surfaces are cylindrical.

4. A nanosynthesis apparatus as defined in claim 1, wherein the outer and inner tubes are quartz tubes.

5. A nanosynthesis apparatus as defined in claim 1, wherein the deposition fluid source is sealingly coupled with the inside of the inner tube at a first end of the inner tube and the aperture is formed through the inner tube and fluidly connects the inside of the inner tube with the gap, thereby fluidly connecting the deposition fluid source with the gap, the apparatus further comprising a partition located inside the inner tube between the aperture and the second end of the gap so that, in the presence of a pressure differential between the first end of the inner tube and the second end of the gap, the deposition fluid flows from the deposition fluid source, along the inside of the inner tube, through the aperture, into the gap, toward the second end of the gap, and away from the first end of the gap.

6. A nanosynthesis apparatus as defined in claim 1, wherein the second fluid is a second deposition fluid.

7. A nanosynthesis apparatus as defined in claim 1, wherein the second fluid is a conditioning fluid.

8. A nanosynthesis apparatus as defined in claim 1, wherein the heater is a tube furnace adapted to circumscribe the outer tube along at least a portion the gap.

9. A nanosynthesis apparatus as defined in claim 1, wherein the inner tube is adapted to rotate within the outer tube.

10. A nanosynthesis apparatus as defined in claim 1, wherein the feed system is adapted to move the growth substrate through the gap along a helical path.

11. A nanosynthesis apparatus, comprising:

an outer tube having an internal surface and a longitudinal axis;

a substrate support surface at least partially disposed within the outer tube and opposing the internal surface of the outer tube across a gap having opposite ends and circumscribing the substrate support surface;

a deposition fluid source in fluid communication with the gap and operable to provide a deposition fluid to the gap such that the deposition fluid flows along the gap in a direction from one of the opposite ends toward the other of the opposite ends, wherein the deposition fluid comprises a constituent to be deposited on a growth substrate in the gap;

a heater arranged to heat at least a portion of the gap;

a feed system arranged to provide the growth substrate in the gap and onto the substrate support surface at an angle with respect to the longitudinal axis of the outer tube such that a length of the growth substrate wraps around and is in physical contact with the substrate support surface and extends between the ends of the gap, whereby the growth substrate is exposed to the deposition fluid flowing along the gap;

an inner tube that includes the substrate support surface, the deposition fluid source being in fluid communication with the inside of the inner tube; and an aperture extending through the inner tube at a location between the ends of the gap, wherein the deposition fluid source is in fluid communication with the gap via the inner tube and the aperture such that the deposition fluid flows along only a portion of the gap.

12. A nanosynthesis apparatus as defined in claim 11, wherein the feed system is configured to move the growth substrate through the gap in a direction from one end to the other end and in a first rotational direction about the longitudinal axis, and wherein the substrate support surface is configured to rotate about the longitudinal axis in a second rotational direction opposite from the first rotational direction.

13. A nanosynthesis apparatus as defined in claim 11, wherein the gap has an annular cross-section.

14. A method of nanosynthesis, comprising the steps of:
(a) placing the growth substrate in a reaction chamber defined along the gap of the nanosynthesis apparatus of claim 11; and
(b) flowing the deposition fluid through at least a portion of the reaction chamber in the axial direction, whereby said constituent of the deposition fluid is deposited along the growth substrate as part of a nanostructure.

15. The method of claim 14, wherein the growth substrate is arranged along a helical path while in the reaction chamber.

16. The method of claim 14, further comprising the step of:
moving the growth substrate through the reaction chamber in the axial direction.

17. The method of claim 16, further comprising the step of:
moving the growth substrate through the reaction chamber in an opposite axial direction.

18. The method of claim 14, wherein the growth substrate is a metal foil.

19. The method of claim 14, wherein nanoparticles are present along a surface of the growth substrate.

20. The method of claim 14, wherein step (b) comprises flowing the deposition fluid into the reaction chamber at a location between the opposite ends of the gap.

21. The method of claim 20, further comprising the step of flowing a second fluid through the reaction chamber so that the deposition fluid and the second fluid flow together along a portion of the reaction chamber.

22. The method of claim 21, wherein the second fluid is a second deposition fluid.

23. The method of claim 21, wherein the second fluid is a conditioning fluid.

24. The method of claim 21, wherein at least one of the fluids is a gas.

25. The method of claim 21, wherein at least one of the fluids is a liquid.

26. The method of claim 21, wherein the deposition fluid comprises a hydrocarbon and the second fluid comprises hydrogen, an inert gas, or both.

27. The method of claim 14, wherein the method comprises flowing three or more fluids from three or more separate fluid sources through at least a portion of the reaction chamber, one of the three or more fluids being said deposition fluid.

28. The method of claim 27, wherein at least two of the fluids enter the reaction chamber at different locations along the length of the reaction chamber.

29. A method comprising synthesizing carbon nanotubes according to claim claim 14.

30. A method comprising synthesizing graphene according to claim 14.

31. A method comprising atomic layer deposition according to claim 14.

32. A method comprising synthesizing nanowires comprising zinc oxide, silicon, or any combination thereof according to claim 14.

33. A nanosynthesis apparatus, comprising:
an outer tube having an internal surface;
an inner tube at least partially disposed within the outer tube, the inner tube having a first end, a second end, and an external surface that opposes the internal surface of the outer tube across a gap that circumscribes the inner tube between first and second ends of the gap;
a deposition fluid source sealingly coupled with the inside of the inner tube at the first end of the inner tube;
an aperture formed through the inner tube between the first and second ends of the gap and fluidly connecting the inside of the inner tube with the gap, thereby fluidly connecting the deposition fluid source with the gap via the aperture;
a partition located inside the inner tube between the aperture and the second end of the inner tube so that, in the presence of a pressure differential between the first end of the inner tube and the second end of the gap, deposition fluid flows from the deposition fluid source, along the inside of the inner tube, through the aperture, into the gap, toward the second end of the gap, and away from the first end of the gap;
a heater arranged to heat at least a portion of the gap; and
a feed system arranged to provide a growth substrate in the gap at an angle with respect to a longitudinal axis of the apparatus such that the growth substrate wraps around the inner tube and extends between the first and second ends of the gap, whereby the growth substrate is exposed to the deposition fluid flowing along the gap.

34. A nanosynthesis apparatus as defined in claim 33, wherein the feed system is configured to pull the growth substrate through the gap and maintain tension in the growth substrate between the first and second ends of the gap so that the growth substrate is in contact with and slides along the inner tube.

35. A nanosynthesis apparatus as defined in claim 33, wherein the feed system is configured to move the growth substrate through the gap in a direction from the first end of the gap to the second end of the gap and in a first rotational direction about the longitudinal axis, and wherein the inner tube is configured to rotate about the longitudinal axis in a second rotational direction opposite from the first rotational direction.

36. A nanosynthesis apparatus as defined in claim 33, wherein the feed system is configured to move the growth substrate through the gap along a helical path.

* * * * *